(12) United States Patent
Brainard et al.

(10) Patent No.: US 7,723,280 B2
(45) Date of Patent: May 25, 2010

(54) STRIPPER FOR ELECTRONICS

(75) Inventors: Robert L. Brainard, Wayland, MA (US); Robert L. Auger, Hopedale, MA (US); Joseph F. Lachowski, Sutton, MA (US)

(73) Assignee: Rohm and Haas Electronic Materials LLC, Marlborough, MA (US)

( * ) Notice: Subject to any disclaimer, the term of this patent is extended or adjusted under 35 U.S.C. 154(b) by 895 days.

(21) Appl. No.: 11/495,304

(22) Filed: Jul. 28, 2006

(65) Prior Publication Data
US 2007/0066502 A1   Mar. 22, 2007

Related U.S. Application Data

(60) Provisional application No. 60/703,409, filed on Jul. 28, 2005.

(51) Int. Cl.
*C11D 7/50* (2006.01)
(52) U.S. Cl. .................................... 510/175; 134/1.3
(58) Field of Classification Search ............... 510/175; 134/1.3
See application file for complete search history.

(56) References Cited

U.S. PATENT DOCUMENTS

| | | | |
|---|---|---|---|
| 3,979,241 A | 9/1976 | Maeda et al. | |
| 4,230,523 A | 10/1980 | Gajda | |
| 4,343,677 A | 8/1982 | Kinsbron et al. | |
| 5,320,709 A | 6/1994 | Bowden et al. | |
| 5,421,906 A | 6/1995 | Borah | |
| 5,630,904 A | 5/1997 | Aoyama et al. | |
| 5,698,503 A | 12/1997 | Ward et al. | |
| 5,792,274 A | 8/1998 | Tanabe et al. | |
| 5,855,811 A | 1/1999 | Grieger et al. | |
| 5,939,336 A | 8/1999 | Yates | |
| 5,962,385 A | 10/1999 | Maruyama et al. | |
| 5,968,848 A | 10/1999 | Tanabe et al. | |
| 5,972,862 A | 10/1999 | Torii et al. | |
| 6,150,282 A | 11/2000 | Rath et al. | |
| 6,200,891 B1 | 3/2001 | Jagannathan et al. | |
| 6,235,693 B1 | 5/2001 | Cheng et al. | |
| 6,278,704 B1 | 8/2001 | Creamer et al. | |
| 6,350,560 B1 * | 2/2002 | Sahbari | 430/325 |
| 6,372,410 B1 * | 4/2002 | Ikemoto et al. | 430/318 |
| 6,554,912 B2 | 4/2003 | Sahbari | |
| 6,638,899 B1 | 10/2003 | Wakiya et al. | |
| 6,656,894 B2 | 12/2003 | Peters et al. | |
| 6,677,286 B1 | 1/2004 | Rovito et al. | |
| 6,762,132 B1 | 7/2004 | Yates | |
| 6,773,873 B2 | 8/2004 | Seijo et al. | |
| 6,828,289 B2 | 12/2004 | Peters et al. | |
| 6,849,200 B2 | 2/2005 | Baum et al. | |
| 2003/0022800 A1 | 1/2003 | Peters et al. | |
| 2003/0181342 A1 * | 9/2003 | Seijo et al. | 510/175 |
| 2004/0106531 A1 | 6/2004 | Kanno et al. | |
| 2004/0149309 A1 | 8/2004 | Hsu | |
| 2004/0266637 A1 | 12/2004 | Rovito et al. | |
| 2005/0014667 A1 | 1/2005 | Aoyama et al. | |
| 2006/0237392 A1 * | 10/2006 | Auger et al. | 216/83 |
| 2008/0242574 A1 * | 10/2008 | Rath et al. | 510/176 |

FOREIGN PATENT DOCUMENTS

| | | |
|---|---|---|
| EP | 0 622 705 B1 | 5/1997 |
| EP | 0 680 078 B1 | 3/2003 |
| JP | 2000-260761 | 9/2000 |
| WO | WO 2004/009730 A1 | 1/2004 |

OTHER PUBLICATIONS

European Search Report of Corresponding European Application No. 06 25 3892.

* cited by examiner

*Primary Examiner*—Gregory E Webb
(74) *Attorney, Agent, or Firm*—John J. Piskorski

(57) ABSTRACT

Compositions and methods useful for the removal of polymeric material from substrates, such as electronic devices are provided. These compositions and methods are particularly suitable for removing polymer residues from electronic devices following plasma etch processes.

10 Claims, No Drawings

STRIPPER FOR ELECTRONICS

The present invention relates generally to the field of removal of polymeric materials from a substrate. In particular, the present invention relates to compositions and methods for the removal of post etch residue from electronic devices.

Numerous materials containing polymers are used in the manufacture of electronic devices, such as photoresists, solder masks, antireflective coatings, and under layers. For example, a positive-type photoresist is deposited on a substrate. The resist is exposed to patterned actinic radiation. The exposed regions are subject to a dissolution by a suitable developer liquid. After the pattern has been thus defined in the resist, it is transferred to the substrate, such as by plasma etching. During the etching step, a plasma etch residue can be formed along the walls of the etched features and along the side walls of the resist features. Following the etching step, the resist and the etch residue are typically completely removed from the substrate to avoid adversely affecting or hindering subsequent operations or processing steps. Even the partial remains of a resist in an area to be further patterned is undesirable. Also, undesired residue between patterned features can have deleterious effects on subsequent film depositions processes, such as metallization, or cause undesirable surface states and charges leading to reduced device performance.

During the etching step, such as plasma etching, reactive ion etching or ion milling, the resist is subjected to conditions that make its removal difficult. During the plasma etch process, a photoresist film forms a hard to remove polymeric residue on the sidewalls of the various features being etched, as well as on the resist pattern itself. The polymeric residue, which may include organometallic polymer residue, is extensively cross-linked due to the high vacuum and high temperature conditions in the etch chamber, and typically contains a metal. Known cleaning processes do not acceptably remove such polymeric residue.

Fluoride-based removers are conventionally used to remove such post plasma etching residue. U.S. Pat. No. 5,939,336 (Yates) discloses a composition including ammonium fluoride, water, and propylene glycol, where the composition has a pH of 7 to 8. Optionally, such remover may contain a buffer to maintain the pH.

While fluoride-based removers are effective in removing a variety of polymeric reside, such removers may cause excessive etching of a dielectric layer on the substrate, may corrode various metals in the electronic device, may operate at a temperature that is outside the desired process window for the manufacturing process, may not have a long enough bath life to allow sufficient processing time and/or throughput for a cost effective process, or may not be effective at removing all types of post plasma etching residue.

There is a continuing need for removers, particularly post plasma etch polymer removers, that effectively remove polymeric material from a substrate, that do not substantially etch dielectric layers in the substrate, that do not substantially corrode metal layers in the substrate, that have a sufficiently long bath life, and that have etch rates that are stable with time.

The present invention provides a composition for the removal of polymeric material from a substrate including: (a) 0.05 to 5% wt of a fluoride source; (b) 40 to 95% wt of a solvent mixture including a polyhydric alcohol and an ether; (c) 5 to 50% wt water; and (d) a pH adjuster chosen from (1) carbonic acid or its salt and (2) a polycarboxylic acid and a base where the molar ratio of the polycarboxylic acid to the base is 1:1 to 1:10; wherein the composition has a pH of 4 to 8. In one embodiment, the pH is from 6 to 8.

Further, the present invention provides a method of removing polymeric residue from a substrate including the step of contacting a substrate including polymeric residue with the composition described above for a period of time sufficient to remove the polymeric residue.

Also provided by the present invention is a composition for removing polymeric residue from a substrate including: (a) a fluoride source; (b) a solvent mixture including a polyhydric alcohol and an ether; (c) water; and (d) a pH adjuster chosen from (1) carbonic acid or its salt and (2) a polycarboxylic acid and a base where the molar ratio of the polycarboxylic acid to the base is 1:1 to 1:10; wherein the composition has a pH of 4 to 8. Such composition has a TEOS etch rate of $\leq 20$ Å/min at 20° C.

As used throughout the specification, the following abbreviations shall have the following meanings: nm=nanometers; g=grams; g/L=grams per liter; μm=micron=micrometer; ppm=parts per million; °C.=degrees Centigrade; % wt=weight percent; Å=Angstroms; cm=centimeters; min=minute; AF=ammonium fluoride; ABF=ammonium bifluoride; TMAF=tetramethylammonium fluoride; IZ=imidazole; TEA=triethanolamine; DPM=dipropylene glycol monomethyl ether; PGP=propylene glycol n-propyl ether; PGM=propylene glycol monomethyl ether; MPD=2-methyl-1,3-propanediol; PDO=1,3-propanediol; PG=propylene glycol; EG=ethylene glycol; DAP=1,3-diaminopropane; and DBU =1,8-diazabicyclo[5.4.0]undec-7-ene.

The terms "stripping" and "removing" are used interchangeably throughout this specification. Likewise, the terms "stripper" and "remover" are used interchangeably. "Alkyl" refers to linear, branched and cyclic alkyl. The term "substituted alkyl" refers to an alkyl group having one or more of its hydrogens replaced with another substituent group, such as halogen, cyano, nitro, $(C_1-C_6)$alkoxy, mercapto, $(C_1-C_6)$alkylthio, and the like.

The indefinite articles "a" and "an" are intended to include both the singular and the plural. All ranges are inclusive and combinable in any order except where it is clear that such numerical ranges are constrained to add up to 100%.

The compositions useful in the present invention include (a) 0.05 to 5% wt of a fluoride source; (b) 40 to 95% wt of a solvent mixture comprising a polyhydric alcohol and an ether; (c) 5 to 50% wt water; and (d) a pH adjuster chosen from (1) carbonic acid or its salt and (2) a polycarboxylic acid and a base wherein the molar ratio of the polycarboxylic acid to the base is 1:1 to 1:10; wherein the composition has a pH of 4 to 8.

A wide variety of fluoride sources may be used in the present invention. In one embodiment, the fluoride source has the general formula $R^1R^2R^3R^4N^+F^-$, wherein $R^1$, $R^2$, $R^3$ and $R^4$ are independently chosen from hydrogen, $(C_1-C_{10})$alkyl, and substituted $(C_1-C_{10})$alkyl. Other suitable fluoride sources include ammonium bifluoride, ammonium-tetraalkylammonium bifluoride, ammonium borofluoride, and fluoroboric acid. It will be appreciated by those skilled in the art that a mixture of fluoride sources may be used, such as a mixture of ammonium fluoride and ammonium bifluoride. In one embodiment, the fluoride source is chosen from ammonium fluoride, ammonium bifluoride, tetraalkylammonium fluoride, ammonium-tetraalkylammonium bifluoride, and mixtures thereof. Exemplary tetraalkylammonium fluoride compounds include, without limitation, tetramethylammonium fluoride and tetrabutylammonium fluoride. In a particular embodiment, the fluoride source is chosen from ammonium fluoride, ammonium bifluoride and mixtures thereof.

The fluoride source is typically present in the compositions of the present invention in an amount of from 0.05 to 5% wt based on the total weight of the composition, preferably from 0.1 to 5% wt, and more preferably from 0.5 to 3.5% wt. Those skilled in the art will appreciate that higher levels of fluoride source may be used in the present compositions, such as up to 10% wt, or even greater. Fluoride sources are generally commercially available and may be used without further purification.

The polyhydric alcohols useful in the present invention are any which are miscible with water and do not destabilize the composition. The term "polyhydric alcohol" refers to an alcohol having 2 or more hydroxyl groups. Suitable polyhydric alcohols include aliphatic polyhydric alcohols such as ($C_2$-$C_{20}$)alkanediols, substituted ($C_2$-$C_{20}$)alkanediols, ($C_2$-$C_{20}$) alkanetriols, and substituted ($C_2$-$C_{20}$)alkanetriols. It will be appreciated by those skilled in the art that more than one polyhydric alcohol may be used in the present invention. Suitable aliphatic polyhydric alcohols include, but are not limited to, ethylene glycol, dihydroxypropanes such as 1,3-propanediol and propylene glycol, diethylene glycol, dipropylene glycol, triethylene glycol, tripropylene glycol, 2-methyl-1,3-propanediol, butanediol, pentanediol, hexanediol, and glycerol. In one embodiment, the polyhydric alcohol is chosen from 1,3-propanediol, propylene glycol, 2-methyl-1,3-propanediol, butanediol, and pentanediol. Polyhydric alcohols are generally commercially available, such as from Aldrich (Milwaukee, Wis.), and may be used without further purification.

The ethers useful in the present invention are any which are water miscible, compatible with the polyhydric alcohol and do not destabilize the composition. A wide variety of ether solvents may be used in the present compositions. Suitable ether solvents contain at least one ether linkage and may contain one or more other groups such as hydroxyl, amino, amido, keto, and halo. Suitable ethers include, without limitation, glycol mono($C_1$-$C_6$)alkyl ethers and glycol di($C_1$-$C_6$) alkyl ethers, such as ($C_2$-$C_{20}$)alkanediol ($C_1$-$C_6$)alkyl ethers and ($C_2$-$C_{20}$)alkanediol di($C_1$-$C_6$)alkyl ethers. Exemplary ethers include, but are not limited to, ethylene glycol monomethyl ether, diethylene glycol monomethyl ether, propylene glycol monomethyl ether, propylene glycol dimethyl ether, propylene glycol mono-n-propyl ether, propylene glycol mono-n-butyl ether, dipropylene glycol monomethyl ether, dipropylene glycol dimethyl ether, dipropylene glycol mono-n-butyl ether, and tripropylene glycol monomethyl ether. In one embodiment, the ether is dipropylene glycol monomethyl ether or dipropylene glycol mono-n-butyl ether. Those skilled in the art will appreciate that mixtures of ethers may be used in the present invention. Suitable ether solvents are generally commercially available, such as from Aldrich, and may be used without further purification.

The present solvent mixture includes a polyhydric alcohol and an ether. Typically, the solvent mixture is present in an amount of 40 to 95% wt, based on the total weight of the composition. In one embodiment, the solvent mixture is present in an amount from 45 to 85% wt, and more typically from 60 to 85% wt. The weight ratio of polyhydric alcohol to ether in the solvent mixture may vary over a wide range, such as from 1:8 to 8:1 and more typically from 1:4 to 4:1. Particularly useful weight ratios of polyhydric alcohol to ether are 2.5:1, 2:1, 1.5:1, 1:1, 1:1.5, and 1:2.

Any suitable type of water may be used in the present invention, such as deionized and distilled, with deionized water being typically used. Water is typically present in the composition in an amount from 5 to 50% wt based on the total weight of the composition, although greater and lesser amounts may be used. More typically, water is present in an amount of 15 to 50% wt based on the total weight of the composition, still more typically from 15 to 35% wt, and even more typically from 15 to 30% wt.

The present compositions have a pH in the range of 4 to 8. In one embodiment, the pH is in the range of 6 to 8. The pH of the compositions is adjusted and maintained by the use of a pH adjuster chosen from (1) carbonic acid or its salt and (2) a polycarboxylic acid and a base wherein the molar ratio of the polycarboxylic acid to the base is 1:1 to 1:10. Exemplary carbonic acid salts include, without limitation, ammonium carbonate.

A wide variety of polycarboxylic acids may be used in the present invention. Such polycarboxylic acids possess at least one carboxylic acid group having a pKa in the range of 3 to 7, and preferably in the range of 4 to 6.5. "Polycarboxylic acid" refers to any carboxylic acid having 2 or more carboxylic acid groups. In one embodiment, the polycarboxylic acid has 3 or more carboxylic acid groups. The polycarboxylic acids may have one or more substituents, such as hydroxyl, keto, and halo. Exemplary polycarboxylic acids include, without limitation, citric acid, isocitric acid, tartaric acid, oxalic acid, malonic acid, succinic acid, glutaric acid, adipic acid, maleic acid, fumaric acid, phthalic acid, L-glutamic acid, cis-aconitic acid, agaric acid, trans-aconitic acid, trimellitic acid, 4-(2-hydroxyethyl)piperazine-1-ethanesulfonic acid ("HEPES"), and trimesic acid. In one embodiment, the polycarboxylic acid is citric acid.

A wide variety of amines may be used in the present invention. Suitable amines, when protonated, typically have a pKa in the range of 5 to 10, and preferably 6 to 9. Suitable amines include, but are not limited to, alkyldiamines, imines, cyclic amines and alkanolamines. Exemplary amines include, without limitation, 1,2-diaminopropane, morpholine, piperazine, imidazole, 1,2-dimethylimidazole, 1-methylimidazole, ethanolamine, diethanolamine, triethanolamine, triisopropanolamine, 1,8-diazabicyclo[5.4.0]undec-7-ene, 2,2-bis(hydroxymethyl)-2,2',2"-nitrilotriethanol ("bis-tris"), 3-(cyclohexylamino)-1-propanesulfonic acid, L-Histidine, 4-(N-morpholino)butanesulfonic acid, 4-morpholinepropanesulfonic acid, 3-morpholino-2-hydroxypropanesulfonic acid, N,N-dimethylethanolamine, N,N-dimethylisopropanolamine, N-methyldiethanolamine, N-methylethanolamine, diisopropanolamine, 1,2-propylenediamine, 1,3-diaminopropane, 2-(2-aminoethoxy)-ethanol, and 2-[2-(dimethylamino)ethoxy]ethanol.

When the pH adjuster is a polycarboxylic acid and a base, the molar ratio of the polycarboxylic acid to the base is typically 1:1 to 1:15. In general, the amine is present in a molar excess as compared to the polycarboxylic acid. Preferably, the molar ratio of the polycarboxylic acid to the base is from 1:1.1 to 10, more preferably from 1:1.5 to 1:10, and still more preferably from 1:2 to 1:8. A preferred pH adjuster is a polycarboxylic acid having 3 carboxylic acid groups and an amine, more preferably a cyclic amine.

The compositions of the present invention may optionally include one or more additives. Suitable optional additives include, but are not limited to, corrosion inhibitors, surfactants, co-solvents, chelating agents, and reducing agents.

Any suitable corrosion inhibitor may be used in the present compositions. The choice of such corrosion inhibitor will depend, in part, upon what needs to be protected from corrosion, e.g. specific metals or dielectrics. The selection of such corrosion inhibitors is within the ability of those skilled in the art. Exemplary corrosion inhibitors include, but are not limited to, hydroxybenzenes such as catechol, methylcatechol, ethylcatechol and tert-butylcatechol; benzotriazole; imidazole; benzimidazole; benzimidazolecarboxylic acid; imidazole-2-carboxylic acid; imidazole-4-carboxylic acid; imidazole-2-carboxaldehyde; imidazole-4-carboxaldehyde; 4-imidazoledithiocarboxylic acid; imidazo[1,2-a]pyridine; hydroxyanisole; gallic acid; gallic acid esters such as methyl gallate and propyl gallate; and tetra($C_1$-$C_4$)alkylammonium silicates such as tetramethylammonium silicate. Such corrosion inhibitors are generally commercially available from a variety of sources, such as Aldrich and may be used without further purification. When such corrosion inhibitors are used in the present compositions, they are typically present in an amount of from 0.01 to 10% wt, based on the total weight of the composition.

Nonionic, anionic and cationic surfactants may be used in the present compositions. Nonionic surfactants are preferred. Such surfactants are generally commercially available from a variety of sources. The surfactants are typically present in an amount of from 0 to 1% wt, and more typically from 0.005 to 0.5% wt, based on the total weight of the composition.

Suitable co-solvents useful in the compositions are any which are water miscible, stable to hydrolysis and do not destabilize the present compositions. Such suitable co-solvents include, but are not limited to, polar aprotic solvents such as dimethyl sulfoxide, tetramethylene sulfone (or sulfolane), and dimethyl sufur dioxide; aminoalcohols such as aminoethylaminoethanol; N-($C_1$-$C_{10}$)alkylpyrrolidones such as N-methylpyrrolidone ("NMP"), N-ethylpyrrolidone, N-hydroxyethylpyrrolidone and N-cyclohexylpyrrolidone; and amides such as dimethylacetamide ("DMAC") and dimethylformamide. In one embodiment, the present compositions are free of dimethyl sulfoxide. In another embodiment, the present compositions are free of amide solvents. When such co-solvents are used they are typically present in an amount of 1 to 45% wt, based on the total weight of the composition, and preferably 5 to 35% wt.

Any suitable chelating agent may be used in the present invention, such as ethylenediaminetetraacetic acid ("EDTA"), and amino acids. Such chelating agents may be used in varying amounts, such as up to 10% wt, based on the total weight of the composition, and more typically up to 5% wt. the use of such chelating agents is within the ability of those skilled in the art.

A wide variety of reducing agents may be used in the present compositions. Exemplary reducing agents include, without limitation: reducing sugars such as sorbitol, arabitol, mannitol, sucrose, dextrose, maltose, and lactose; hydroquinones such as chlorohydroquinone, 2,3-dichlorohydroquinone, 2,5-dichlorohydroquinone, 2,6-dichlorohydroquinone, and methylhydroquinone; glyoxal; salicylaldehyde; ascorbic acid; nonanal; pyruvaldehyde; 2-methoxybenzaldehyde; vanillin; imidazole-2-carboxaldehyde; and imidazole-2-carboxaldehyde.

Such reducing agents may be present in an amount from 0 to 15% wt, based on the total weight of the composition. More typically, such reducing agents are present from 0.1 to 10% wt, and still more typically from 0.5 to 5% wt.

The compositions of the present invention may be prepared by combining the above components in any order. Preferably, the fluoride source is dissolved in the minimum amount of water required for dissolution of the fluoride source and then to the resulting solution is added the remainder of the components in any order.

The compositions of the present invention are suitable for removing post-plasma etch polymeric material from a substrate. Any polymeric material, such as, but not limited to, photoresists, soldermasks, antireflective coatings, underlayers and the like, that have been subjected to harsh process conditions such as plasma etching, auto-plasma ashing, ion implantation or ion milling processes, can be effectively removed from a substrate according to the present invention. Any polymeric material subjected to the harsh treatment processes described above is referred to as "post-plasma etch polymeric residue" throughout this specification. The compositions and methods of the present invention are particularly useful in removing the organometallic polymeric residue present after a dry plasma etching, reactive ion etching and ion milling of materials, such as photoresists, conducting metal layers and insulating dielectric layers.

Polymeric residue on a substrate may be removed by contacting the substrate with a composition of the present invention. The substrate may be contacted with the compositions of the present invention by any known means, such as immersion of the substrate in a bath, such as a wet chemical bench, containing a composition of the present invention such bath being at room temperature or heated, or by spraying a composition of the present invention at a desired temperature on the surface of the substrate. Following contact with the compositions of the present invention for a time sufficient to remove the polymeric residue, the substrate is typically rinsed such as with deionized water or iso-propanol, and is then dried such as by spin drying. When the compositions of the present invention are sprayed on a substrate, such spraying operation is typically performed in a spray chamber such as a solvent cleaning spray apparatus available from Semitool, Inc. (Kalispell, Mont.). The time the substrate is in contact with a composition of the present invention will vary depending, in part, upon the concentration of fluoride ion in the composition, the amount of water in the composition, the temperature of the composition, and the type of polymeric residue being removed. Typical contact times range from 5 seconds to 60 minutes.

The polymeric residue removal process of the present invention may be carried out at a variety of temperatures, such as ambient temperature or at any other suitable temperature such as from 15 to 65° C., preferably from 20 to 50° C.

An advantage of the compositions of the present invention is that they may be effectively used to remove polymeric material from substrates including one or more dielectric layers without substantially etching the dielectric material. Typically, the compositions of the present invention etch dielectric materials at a rate of $\leq 50$ Å/min, preferably at a rate of $\leq 20$ Å/min, and more preferably at a rate of $\leq 10$ Å/min, at 20° C. Thus, the present compositions are compatible with a wide variety of dielectric materials, particularly low dielectric constant ("low-k") materials, such as, but not limited to, siloxanes, silicon dioxides, silsesquioxanes such as hydrogen silsesquioxane, methyl silsesquioxane, phenyl silsesquioxane and mixtures thereof, benzocyclobutenes ("BCB"), polyarylene ethers, polyaromatic hydrocarbons, and fluorinated silicon glasses.

The compositions of the present invention are particularly useful in removing post plasma etch residues when other conventional strippers are not capable of removing such residues. Furthermore the present compositions are substantially non-corrosive to substrates containing metals, particularly copper and aluminum.

The following examples are expected to illustrate various aspects of the invention.

EXAMPLE 1

The compositions in the following table were prepared by combining the components in the amounts listed in the following table. All amounts were % wt.

| Sample | PDO | DPM | H$_2$O | AF | Citric Acid | IZ | TEA |
|---|---|---|---|---|---|---|---|
| 1 | 34.875 | 34.875 | 25 | 0.25 | 3.0 | 2.00 | 0 |
| 2 | 33.65 | 33.65 | 25 | 1.30 | 1.0 | 0 | 5.4 |
| 3 | 37.15 | 37.15 | 20 | 1.20 | 1.0 | 0 | 3.5 |
| 4 | 34.5 | 34.5 | 25 | 1.00 | 3.0 | 2.00 | 0 |
| 5 | 34.325 | 34.325 | 25 | 0.50 | 2.0 | 3.85 | 0 |
| 6 | 33.975 | 33.975 | 25 | 0.65 | 1.0 | 0 | 5.4 |
| 7 | 36.825 | 36.825 | 20 | 0.50 | 2.0 | 3.85 | 0 |
| 8 | 39.2 | 39.2 | 20 | 1.60 | 0 | 0 | 0 |
| 9 | 40.475 | 40.475 | 15 | 0.05 | 3.0 | 1.00 | 0.0 |
| 10 | 27.775 | 27.775 | 40 | 0.05 | 3.7 | 0.70 | 0.0 |
| 11 | 29.1 | 29.1 | 25 | 3.40 | 1.8 | | 11.6 |
| 12 | 29.5 | 29.5 | 25 | 3.40 | 1.8 | 10.80 | |
| 13 | 55.35 | 25.6 | 15 | 0.05 | 3.0 | 1.00 | 0.0 |
| 14 | 29.95 | 25.6 | 40 | 0.05 | 3.7 | 0.70 | 0.0 |
| 15 | 25.20 | 33 | 25 | 3.40 | 1.8 | | 11.6 |
| 16 | 30.80 | 38.3 | 20 | 4.7 | 2.2 | | 4 |

EXAMPLE 2

Silicon wafers (200 mm) coated with blanket films of various materials, such as copper ("Cu"), aluminum alloyed with 0.5% copper ("AlCu"), titanium ("Ti"), tungsten ("W"), tantalum ("Ta"), silicon nitride (SiN), titanium nitride (TiN), tantalum nitride (TaN), silicon oxide ("TEOS"), tantalum oxide (Ta$_2$O$_5$), and aluminum oxide (Al$_2$O$_3$), were cleaved into 2 cm×2 cm pieces. The initial thickness of the particular film was determined by the appropriate measurement technique. Metal film thickness was determined by utilizing a Four Dimensions Model 280 automatic four point probe meter, and nitride and oxide film thicknesses were determined utilizing a Nanometrics Nanospec/AFT Model 5000Series instrument.

Samples of the formulation to be tested were placed in small plastic beakers and, if needed, equilibrated to the test temperature. Half of the formulation samples were aged for 21.5 hours at 26° C. prior to use, the other half of the formulation samples were used fresh. Pre-measured squares of blanket films were then placed in the formulation with the desired amount and type of agitation (e.g. stir bar, manual reciprocal motion, automated reciprocal motion, static). After the specified length of time the squares of blanket films were then removed from the formulation and immediately rinsed with deionized water for one minute, followed by drying with filtered nitrogen gas. The final film thickness was then measured and the etch loss determined by the difference between the initial and final thicknesses. Etch loss was then converted to etch rate by dividing by the length of time the blanket film was in contact with the chemical solution. These etch rates results, in Å/min, are reported in the following table. FOx is a flowable oxide product, available from Dow Corning.

| | Fresh Formulation Samples | | | | | Aged Formulation Samples | | | | |
|---|---|---|---|---|---|---|---|---|---|---|
| Sample | pH | TEOS | FOx | Al | W | pH | TEOS | FOx | Al | W |
| 2 | 7.85 | 0.83 | 9.07 | 0.24 | 0.25 | 7.56 | 1.83 | 20.61 | 0.22 | −0.69 |
| 3 | ~7.5 | 2.65 | 22.71 | −1.87 | | | | | | |
| 4 | 5.04 | 51.80 | | | | | | | | |
| 5 | 6.96 | 1.42 | 26.46 | 1.05 | −0.10 | 6.97 | 2.01 | 31.49 | 1.39 | 0.94 |
| 6 | 7.86 | 0.06 | 1.70 | 2.42 | 0.25 | 7.7 | 0.24 | 2.15 | −0.78 | 0.48 |
| 7 | 7.06 | 1.95 | 55.47 | 0.21 | 1.35 | 6.95 | 3 | 81 | 3.74 | 0.72 |
| 8 | 8.03 | 1.17 | 7.41 | 2.16 | −0.27 | 6.8 | 5.72 | 55 | −0.27 | −0.06 |

EXAMPLE 3

Example 1 is repeated except that the components and amounts listed in the following table are used. These samples are expected to perform similarly to those in Example 1.

EXAMPLE 4

Example 1 is repeated except that the components and amounts listed in the following table are used. These samples are expected to perform similarly to those in Example 1.

| Sample | Formulation |
|---|---|
| 17 | 34.5% PG/33% PGP/25.0% H$_2$O/0.5% ABF/1.0% agaric acid/3.0% Bis-Tris/3.0% glyoxal |
| 18 | 28.0% PG/27.0% PGP and 10.0% PGM/30.0% H$_2$O/1.0% ABF/2.0% phthalic acid/2.0% DBU |
| 19 | 33.7% PG/33.0% PGP/22.0% H$_2$O/0.8% ABF/15.0% trimellitic acid/4.0% L-histidine/4.0% ascorbic acid/1.0% benzotriazole |
| 20 | 33.4% PDO/31.0% PGP and 10.0% PGM/15.0% H$_2$O/3.0% TMAF/2.0% trimesic acid/3.6% 1-methylimidazole/2.0% nonanal |
| 21 | 18.0% PG/25.0% DPM/40.0% H$_2$O/1.0% TMAF/1.0% citric acid/4.0% TEA/10.0% glyoxal/1.0% benzotriazole |
| 22 | 44.0% PG/27.0% PGP/25.0% H$_2$O/2.0% ABF/1.0% maleic acid/1.0% ammonium carbonate |
| 23 | 44.0% PG/27.0% PGP/25.0% H$_2$O/2.0% ABF/1.0% succinic acid/1.0% ammonium carbonate |
| 24 | 41.0% PG/27.0% PGP/25.0% H$_2$O/2.0% TMAF/1.0% ammonium carbonate/4.0% pyruvaldehyde |
| 25 | 12.5% PDO and 12.5% PG/32.2% DPM/35.0% H$_2$O/1.0% AF and 0.8% ABF/2.0% citric acid/3.5% TEA/0.5% nonionic surfactant |
| 26 | 22.8% MPD/32.0% DPM/36.5% H2O/2.2% ABF/2.0% citric acid/4.5% DAP |

What is claimed is:

1. A composition for the removal of polymeric material from a substrate comprising: (a) 0.05 to 5% wt of a fluoride source; (b) 40 to 95% wt of a solvent mixture comprising a polyhydric alcohol and an ether; (c) 5 to 50% wt water; and (d) a pH adjuster chosen from (1) carbonic acid or its salt and (2) a polycarboxylic acid and a base where the molar ratio of the polycarboxylic acid to the base is 1:1 to 1:10; wherein the composition has a pH of 4 to 8.

2. The composition of claim 1 wherein the fluoride source is chosen from ammonium fluoride, ammonium bifluoride, tetraalkylammonium fluoride, ammonium-tetraalkylammonium bifluoride, and mixtures thereof.

3. The composition of claim 1 wherein the polycarboxylic acid has 3 carboxylic acid groups.

4. The composition of claim 1 wherein the polycarboxylic acid is chosen from citric acid, isocitric acid tartaric acid, oxalic acid, malonic acid, succinic acid, glutaric acid, adipic acid, maleic acid, fumaric acid, phthalic acid, 4-(2-hydroxyethyl)piperazine-1-ethanesulfonic acid, L-glutamic acid, cis-aconitic acid, agaric acid, trans-aconitic acid, trimellitic acid and trimesic acid.

5. The composition of claim 1 wherein the base is chosen from alkyldiamines, imines, cyclic amines and alkanolamines.

6. The composition of claim 5 wherein the cyclic amine is chosen from morpholine, imidazole, morpholine, piperazine, 1,2-dimethylimidazole, 1-methylimidazole, L-Histidine, 4-(N-morpholino) butanesulfonic acid, 4-(N-morpholino) propanesulfonic acid, 3-morpholino-2-hydroxypropanesulfonic acid, and 1,8-diazabicyclo[5.4.0]undec-7-ene.

7. The composition of claim 1 wherein the pH is from 6 to 8.

8. The composition of claim 1 further comprising an additive chosen from corrosion inhibitors, surfactants, co-solvents, chelating agents, reducing agents and mixtures thereof.

9. A method of removing polymeric residue from a substrate comprising the step of contacting a substrate comprising polymeric residue with the composition of claim 1 for a period of time sufficient to remove the polymeric residue.

10. A composition for removing polymeric residue from a substrate comprising: (a) a fluoride source; (b) a solvent mixture comprising a polyhydric alcohol and an ether; (c) water; and (d) a pH adjuster chosen from (1) carbonic acid or its salt and (2) a polycarboxylic acid and a base where the molar ratio of the polycarboxylic acid to the base is 1:1 to 1:10; wherein the composition has a pH of 4 to 8.

* * * * *